United States Patent [19]

Fisher

[11] Patent Number: 4,520,554
[45] Date of Patent: Jun. 4, 1985

[54] METHOD OF MAKING A MULTI-LEVEL METALLIZATION STRUCTURE FOR SEMICONDUCTOR DEVICE

[75] Inventor: Albert W. Fisher, Ringoes, N.J.

[73] Assignee: RCA Corporation, Princeton, N.J.

[21] Appl. No.: 676,948

[22] Filed: Nov. 30, 1984

Related U.S. Application Data

[62] Division of Ser. No. 465,640, Feb. 10, 1983.

[51] Int. Cl.³ .......................................... H01L 21/388
[52] U.S. Cl. ...................................... 29/591; 29/589; 29/590; 427/90
[58] Field of Search .......................... 29/589, 590, 591; 427/90

[56] References Cited

U.S. PATENT DOCUMENTS

| | | | |
|---|---|---|---|
| 3,501,829 | 3/1970 | Corwin | 29/577 |
| 3,609,470 | 9/1971 | Kuiper | 357/67 |
| 3,881,971 | 5/1975 | Greer | 156/11 |
| 4,011,583 | 3/1977 | Levinstein et al. | 357/67 |
| 4,121,241 | 10/1978 | Drake et al. | 357/71 |
| 4,200,969 | 5/1980 | Aoyama et al. | 29/577 |
| 4,289,834 | 9/1981 | Alcorn et al. | 428/601 |
| 4,333,100 | 6/1982 | Morcom et al. | 357/71 |
| 4,433,004 | 2/1984 | Yonezawa et al. | 29/591 X |

FOREIGN PATENT DOCUMENTS 0019883 10/1980 European Pat. Off. ............ 357/65

Primary Examiner—George T. Ozaki
Attorney, Agent, or Firm—Birgit E. Morris; Donald S. Cohen

[57] ABSTRACT

A semiconductor device having a multi-level metallization system wherein the first level is of aluminum containing up to 3 of percent silicon and the second level is either aluminum or aluminum containing silicon in an amount less than that contained in the first level. The two levels where they contact each other are sintered together with some of the silicon from the first level being diffused into the second level so that the second level has a region adjacent the junction between the two levels which has a higher content of silicon than the remaining portion of the second level. When making the device, the surface of the first level where it is to be joined with the second level is etched to remove some of the aluminum, but not the silicon, which roughens this surface. The second level is applied on this roughened surface and the device is heated to sinter the two levels together and diffuse the silicon into the second level.

5 Claims, 5 Drawing Figures

METHOD OF MAKING A MULTI-LEVEL METALLIZATION STRUCTURE FOR SEMICONDUCTOR DEVICE

This is a division of application Ser. No. 465,640, filed Feb. 10, 1983.

BACKGROUND OF THE INVENTION

The present invention relates to a multi-level metallization structure for a semiconductor device, particularly an integrated circuit, and a method of making the same. More particularly, the present invention relates to a multi-level metallization structure which uses aluminum and which provides good ohmic contact between the levels.

In the manufacture of semiconductor integrated circuits, the trend is directed toward increasing the number of components per unit area of the circuit chip in order to reduce the cost per circuit function. This increase is achieved by reducing the size of the components themselves and/or reducing the spacing between the components. However, one of the factors which limits the decrease in size and spacing is the area required by the metal interconnections used to connect the various components in a desired circuit.

One technique for overcoming the metal interconnection problem is to use multi-level metallization systems. Multi-level metallization systems include forming contact openings through the particular insulating layer which is over the substrate of the device to some of the components in the substrate. A first metal layer is deposited on the insulating layer and in the contact openings. The first metal layer is defined to form a portion of the overall metal interconnection system. A layer of insulating material is applied over the defined first metal layer and openings are formed through the insulating layer. Some of the openings can go completely through the insulating layers to some of the components in the substrate and some of the openings merely go through the second insulating layer to the defined first metal layer. A second metal layer is deposited on the second insulating layer and in the contact openings and is defined to form the remaining portion of the overall interconnection system. Thus, the defined second metal layer is connected to some of the components in the substrate and to the defined first metal layer. Additional metal layers may be used if the circuit is sufficiently complex to require them.

A metal commonly used for the metallization in an integrated circuit, because of its high conductivity, ease of application and relatively low cost is aluminum or aluminum containing a small amount of silicon. However, a problem with aluminum is that as soon as it is deposited and exposed to air, a thin layer of aluminum oxide is formed on the surface of the aluminum. Although this aluminum oxide is not a major problem when using aluminum as a single level of metallization, it is a problem for multi-level metallization. The oxide layer provides an insulating layer between the two metallization layers which creates a high resistance where the two layers contact each other. An attempt to minimize the high contact resistance by increasing the contact area has been made by making the area of the openings in the insulating layer between the metallization layers larger than the line width of the defined metallization layer. Heating the device to about 400° C. to break up the aluminum oxide and sinter the two layers together further reduces the resistance. However, it has been found that this does not completely remove the oxide so that the contact resistance is still higher than if no oxide is present. Furthermore, overetching the dielectric to form the oversize contact opening causes undercutting of the dielectric beneath the metal. Undercut edges cause poor step coverage in subsequently deposited layers.

SUMMARY OF THE INVENTION

A semiconductor device includes a substrate of semiconductor material having a first layer of insulating material on a surface thereof and a first conductive layer on the first insulating layer. A second layer of an insulating material is on the first conductive layer and has an opening therethrough to the first conductive layer. A second conductive layer is on the second insulating layer and extends through the opening and contacts the first conductive layer. The first conductive layer is of aluminum containing up to 3 percent of silicon and the second conductive layer is either aluminum or aluminum containing silicon in an amount less than that contained in the first conductive layer. In making the semiconductor device, the first conductive layer is applied over the first insulating layer and the second insulating layer is applied over the first conductive layer. The opening is formed through the second insulating layer and the exposed portion of the first conductive layer is etched with an etchant which removes the aluminum at the exposed surface but leaves exposed the precipitated silicon particles contained in the aluminum-silicon conductive layer. The second conductive layer is then applied and the device is heated to anneal the second conductive layer to the first conductive layer at their interface in the opening in the second insulating layer.

DETAILED DESCRIPTION OF THE PREFERRED EMBODIMENT

Figure 1:
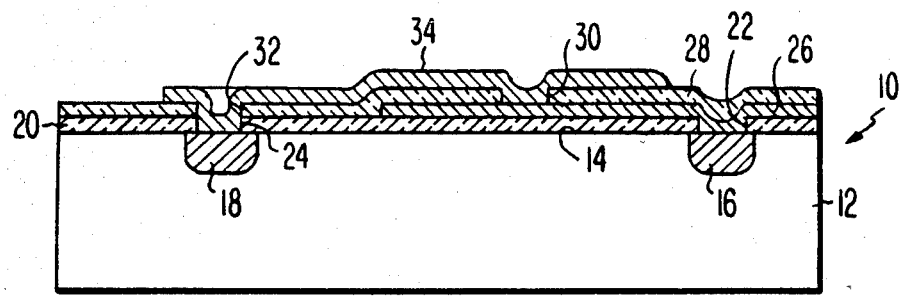
FIG. 1 is a sectional view of a semiconductor device which incorporates the present invention.
Figure 2:
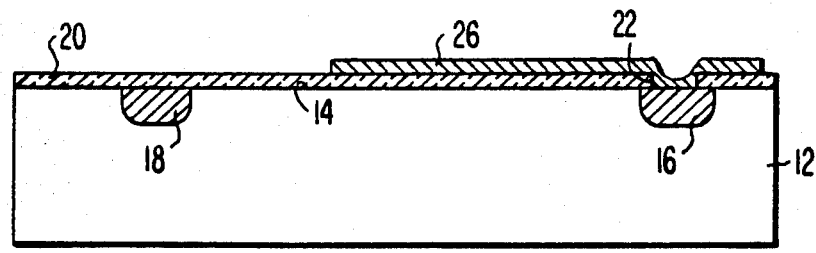
FIGS. 2-5 are sectional views illustrating the various steps of the method of the present invention for making the semiconductor device shown in FIG. 1.

Referring initially to FIG. 1, a semiconductor device which includes the present invention is generally designated as 10. The semiconductor device 10 includes a substrate 12 of a single crystalline semiconductor material, such as silicon, having a major surface 14. Within the substrate 12 and along the surface 14 are various active and passive devices, such as transistors, diodes and resistors, which are to be electrically connected in a desired circuit arrangement. Illustrative of such devices are regions 16 and 18 which may be of different conductivity types from that of the substrate 12 or of the same conductivity type but different resistivity. On the surface 14 of the substrate 12 is a layer 20 of an insulating material, such as silicon dioxide. The first insulating layer 20 has a pair of openings 22 and 24 therethrough to the regions 16 and 18 respectively. A first conductive layer 26 is on a portion of the first insulating layer 20 and extends into the opening 22 to contact the region 16. The first conductive layer 26 is of aluminum containing up to 3 percent of silicon.

A second insulating layer 28 extends over the first conductive layer 26 and the portion of the first insulating layer 20 not covered by the first conductive layer 26. The second insulating layer 28 may be of an inorganic material, such as silicon dioxide or silicon nitride, or an organic material, such as a polyimid. The second insulating layer 28 has two openings 30 and 32 therethrough. The opening 30 extends to the first conductive layer 26 and the opening 32 is in alignment with the opening 24 in the first insulating layer 20 which extends to the region 18. A second conductive layer 34 is over a portion of the second insulating layer 28 and extends into the opening 30 to contact the first conductive layer 26 and through the aligned openings 32 and 24 to contact the region 18. The second conductive layer 34 is of either of aluminum or aluminum containing silicon in an amount less than that contained in the first conductive layer 26. The conductive layers 26 and 34 are defined to form interconnecting strips to electrically connect the various devices in the substrate 12, such as the regions 16 and 18, together and to termination pads for the semiconductor device 10. As will be explained in detail hereinafter, the second conductive layer 34 has a sintered interface with the first conductive layer 26 and has a region adjacent the interface which contains an amount of silicon greater than that which is contained in the remaining portion of the second conductive layer 34. This provides a low resistance contact between the two conductive layers 26 and 34.

To make the semiconductor device 10 using the method of the present invention, the regions 16 and 18 are formed in the substrate 12 using standard semiconductor technology, such as by ion implantation or diffusion. The first insulating layer 20 is then formed on the surface 14. If the first insulating layer 20 is of silicon dioxide, it can be grown on the surface 14 by exposing the surface 14 to oxygen or steam at a temperature of between about 800° C. and 1200° C. The opening 22 is then formed in the first insulating layer 20. This can be achieved by applying a layer of a photoresist over the entire surface of the first insulating layer 20 and patterning it where the opening 22 is to be formed using standard photolithographic techniques. The exposed portion of the first insulating layer 20 is then removed using a suitable etchant, such as buffered hydrofluoric acid for silicon dioxide.

The first conductive layer 26 is then formed. This is achieved by coating a layer of the silicon containing aluminum over the entire surface of the first insulating layer 20 and in the opening 22 using any standard deposition technique, such as evaporation in a vacuum or sputtering. A patterned layer of photoresist is formed over the portion of the silicon-containing-aluminum, which is to form the first conductive layer 26, using standard photolithographic techniques. The uncoated portion of the silicon-containing-aluminum layer is then removed using a suitable etching technique, such as plasma etching or wet chemical etching with said solutions such as 20 parts $H_3PO_4$ to 1 part $HNO_3$ at about 50° C. The photoresist layer is then removed.

Figure 3:
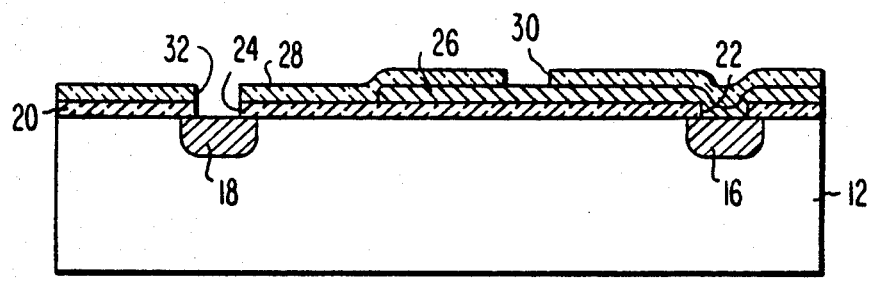

As shown in FIG. 3, the second insulating layer 28 is then coated over the first conductive layer 26 and the exposed portion of the first insulating layer 20. If the second insulating layer is of an inorganic material, such as silicon dioxide or silicon nitride, it can be applied using a standard chemical vapor deposition technique wherein the device is exposed to a gas containing the elements of the second insulating layer and heated to react the gas to deposit the particular material. If the second insulating layer 28 is of an organic material, such as a polyimide, it can be painted or spun on and then cured. The openings 30 and 32 are then formed through the second insulating layer 28 by providing a layer of photoresist over the surface of the second insulating layer 28 and patterning it where the openings 30 and 32 are to be formed using standard photolithographic techniques. The exposed portions of the second insulating layer 28 are then removed using a suitable etching technique for the particular material used for the second insulating layer 28. The opening 24 in the first insulating layer 20 can then be formed by etching the surface of the first insulating layer 20 exposed at the bottom of the opening 32 in the second insulating layer 28. If the second insulating layer 28 is of the same material as the first insulating layer 24, when the opening 32 is formed the etching technique will automatically also etch through the first insulating layer 20 to form the opening 24. However, if the second insulating layer 24 is of a material different from that of the first insulating layer 20, after the opening 32 is formed an appropriate etching technique is then used to form the opening 24.

Figure 4:
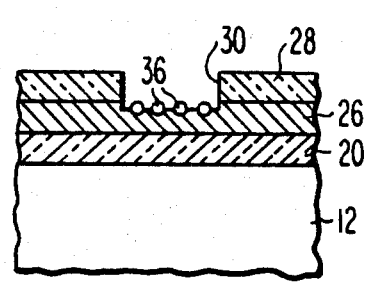

The surface of the first conductive layer 26 exposed at the bottom of the opening 30 in the second insulating layer 28 is then subjected to an etchant which will etch aluminum, but does not etch silicon. As shown in FIG. 4, this will etch away a portion of the aluminum at the exposed surface, leaving silicon particles 36 projecting from the exposed surface. Preferably, about 1000 Angstroms of the aluminum are removed from the exposed surface to achieve a roughened surface provided by the projecting silicon particles 36. Etchants which have been found suitable for this purpose include mixtures of $H_3PO_4$ and $HNO_3$, buffered hydrofluoric acid, dilute hydrofluoric acid, and solutions of $H_2O$, HF, and $CuSO_4$. The mixture containing $CuSO_4$ has been found to work extremely well since copper is plated onto the silicon particles as they are exposed and, depending on the size and density of the silicon particles, limits the etching of the aluminum. The copper plated surface is then immersed in $HNO_3$ to remove the copper and to expose a surface having a high density of silicon particles. This etching step removes any aluminum oxide from the exposed surface and also provides a roughened surface.

The second conductive layer 34 is then formed by depositing a layer of aluminum or aluminum containing an amount of silicon less than that contained in the first conductive layer 26, over the entire surface of the second insulating layer 28 and in the openings 30, 32 and 24. The metal layer is then defined to form the second conductive layer 34 by applying a photoresist over the metal layer and patterning the photoresist so that it covers only the portion of the metal layer which is to form the second conductive layer 34. The uncovered portion of the metal layer is then removed using a suitable etching technique.

Figure 5:
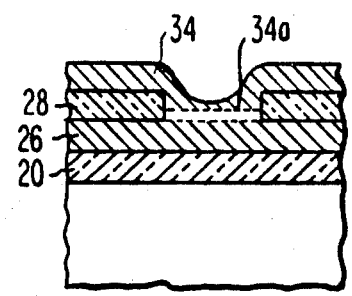

The device 10 is then heated at a temperature of about 400° C. to sinter the second conductive layer 34 to the first conductive layer 26. During sintering, the silicon particles 36 of the first conductive layer 26 are dissolved in the second conductive layer and additional silicon will diffuse from the first conductive layer 26 into the second conductive layer 34 which contains less silicon than that contained in the first conductive layer 26 and the aluminum-silicon will fill areas where the silicon had previously been located at the interface between the two conductive layers. As shown in FIG. 5, this provides a region 34a in the second conductive layer 34 at the interface between the second conductive layer 34 and the first conductive layer 26 which has a content of silicon greater than that contained in the remaining portion of the second conductive layer 34. This sintering of the two conductive layers 26 and 34 provides a good electrical contact between the two layers. Furthermore, the diffusion of the silicon through the interface also breaks up any oxide that was formed on the exposed aluminum and since the top surface of the first conductive layer 26 contains a high density of silicon particles, the area of aluminum exposed to oxidation is reduced considerably. All of these factors serve to provide a good low resistance contact and this low resistance contact can be achieved with very small area contact regions.

The following Examples are given to further illustrate the present invention and are not to be taken in any way restricting the invention beyond the scope of the appended claims.

EXAMPLE I

A group of test pattern devices were made with each device being made by first growing a layer of silicon dioxide on a surface of a single crystalline silicon substrate by heating the substrate in steam at a temperature of about 1100° C. A first metal layer was coated on the silicon dioxide layer by sputtering. The first metal layer was then defined to form forty-five (45) islands of the metal, each island being 32 micrometers by 70 micrometers in size. A layer of silica glass containing 3 percent by weight of phosphorus was deposited over the substrate and the first metal island by chemical vapor deposition process on atmospheric pressure. Ninety (90) openings, each measuring about 10 micrometers by 10 micrometers, were etched through the phosphorus silica glass to the first metal island using buffered hydrofluoric acid. The openings were arranged so that there were two openings to each metal island, with the openings being uniformly spaced across the islands as well as uniformly spaced from island to island. The etching of the openings was carried out long enough to etch the surface of the first metal islands at the bottom of each opening. A second metal layer was then deposited by sputtering over the glass layer and in the openings to contact the first islands. The second metal layer was defined to form a plurality of islands each 32 micrometers by 70 micrometers in size with each island extending from an opening to one of the first islands to an opening to an adjacent first island. Thus, the second islands electrically connected the first islands in series, which included the contacts between the second islands and the first islands. The devices were then heated at 450° C. for 4 hours to anneal the second islands to the first islands.

All of the devices made used aluminum as the second metal layer to form the second islands. In some of the devices, the aluminum second metal layer was one micrometer in thickness and in other devices the aluminum second metal layer was two micrometers in thickness. In some of the devices, the first metal layer was aluminum. In some of the devices, the first metal layer was aluminum containing 1 percent of silicon and in some of the devices the first metal layer was aluminum containing 2 percent of silicon.

For each device, the resistance of the series connected islands was measured. The measured resistance was divided by 90, the number of contacts between the first and second islands, to determine the average contact resistance at each interface between the first and second islands plus the resistance of the metal line between the contact points. Table 1 shows the average resistance for each of the device structure.

TABLE 1

| Metal (First layer/second layer) | Resistance (ohms) |
| --- | --- |
| Al/Al | Too high to measure |
| Al—Si (1%)/Al (1μ) | 0.177 |
| Al—Si (1%)/Al (2μ) | 0.136 |
| Al—Si (2%)/Al (1μ) | 0.168 |
| Al—Si (2%)/Al (2μ) | 0.0875 |

EXAMPLE II

A group of test pattern devices were made in the same manner as described in Example I except that the openings through the phosphorus silica glass were about 15 micrometers by 15 micrometers in size. Table 2 shows the average resistance for each of the device structures.

TABLE 2

| Metal (First layer/second layer) | Resistance (ohms) |
| --- | --- |
| Al/Al | 0.153 |
| Al—Si (1%)/Al (1μ) | 0.113 |
| Al—Si (1%)/Al (2μ) | 0.092 |
| Al—Si (2%)/Al (1μ) | 0.1 |
| Al—Si (2%)/Al (2μ) | 0.061 |

EXAMPLE III

A group of test pattern devices were made in the same manner as described in Example I except that the openings through the phosphorus silica glass were about 20 micrometers by 20 micrometers in size. Table 3 shows the average resistance for each of the device structures.

TABLE 3

| Metal (First layer/second layer) | Resistance (ohms) |
| --- | --- |
| Al/Al | 0.128 |
| Al—Si (1%)/Al (1μ) | 0.1 |
| Al—Si (1%)/Al (2μ) | 0.073 |
| Al—Si (2%)/Al (1μ) | 0.091 |
| Al—Si (2%)/Al (2μ) | 0.053 |

From the above Tables, it can be seen that those devices which used silicon containing aluminum as the first metal had lower contact resistance than the devices in which both metal layers were aluminum. Also, the higher the silicon content of the first metal layer, the lower the contact resistance. In addition, the thicker the second aluminum layer the lower the contact resistance.

I claim:

1. A method of forming a multi-level metallization on a substrate comprising the steps of:

forming a first metallization layer of aluminum containing up to 3 percent of silicon over a surface of a substrate, forming a layer of an insulating material over the first metallization layer, forming an opening through the insulating layer to the first metallization layer, forming a second metallization layer of aluminum containing silicon in an amount less than that contained in the first metallization layer over the insulating layer and in the opening to contact the first metallization layer, and heating the metallization layer to sinter the two layers together at their junction within the opening within the insulating layer and to diffuse some of the silicon from the first metallization layer into the second metallization layer.

2. The method in accordance with claim 1 in which prior to forming the second metallization layer, the surface of the first metallization layer in the opening in the insulating layer is treated to remove some of the aluminum and expose some of the silicon particles at the surface of the first metallization layer.

3. The method in accordance with claim 2 in which the first metallization layer is treated by subjecting it to an etchant which removes aluminum, but not silicon.

4. A method of forming a multi-level metallization on a substrate comprising the steps of:

forming a first metallization layer of aluminum containing up to 3% of silicon over a surface of the substrate, forming a layer of an insulating material over the first metallization layer, forming an opening through the insulating layer to the first metallization layer, treating the surface of the first metallization layer in the opening in the insulating layer to remove some of the aluminum and expose some of the silicon particles at the surface of the first metallization layer, forming a second metallization layer of either aluminum or aluminum containing silicon in an amount less than that contained in the first metallization layer over the insulating layer and in the opening to contact the first metallization layer, and heating the metallization layer to sin the two layers together at their junction within the opening within the insulating layer and to diffuse some of the silicon from the first metallization layer into the second metallization layer.

5. The method in accordance with claim 4 in which the first metallization layer is treated by subjecting it to an etchant which removes aluminum, but not silicon.

* * * * *